(12) United States Patent
Yamamura (10) Patent No.: US 7,529,115 B2
(45) Date of Patent: May 5, 2009

(54) FERROELECTRIC MEMORY DEVICE, ELECTRONIC APPARATUS, AND FERROELECTRIC MEMORY DEVICE DRIVING METHOD

(75) Inventor: Mitsuhiro Yamamura, Suwa (JP)

(73) Assignee: Seiko Epson Corporation (JP)

( * ) Notice: Subject to any disclaimer, the term of this patent is extended or adjusted under 35 U.S.C. 154(b) by 103 days.

(21) Appl. No.: 11/642,701

(22) Filed: Dec. 20, 2006

(65) Prior Publication Data

US 2007/0139993 A1 Jun. 21, 2007

(30) Foreign Application Priority Data

Dec. 20, 2005 (JP) .............................. 2005-366999

(51) Int. Cl.
*G11C 11/22* (2006.01)
(52) U.S. Cl. ..................... 365/145; 365/205; 365/149; 365/65; 365/189.08; 365/203
(58) Field of Classification Search ................ 365/145, 365/149, 65, 203, 189.08
See application file for complete search history.

(56) References Cited

U.S. PATENT DOCUMENTS

| | | | | |
|---|---|---|---|---|
| 5,119,329 A | * | 6/1992 | Evans et al. | 365/145 |
| 5,262,982 A | * | 11/1993 | Brassington et al. | 365/145 |
| 5,487,032 A | * | 1/1996 | Mihara et al. | 365/145 |
| 5,666,305 A | * | 9/1997 | Mihara et al. | 365/145 |
| 5,721,699 A | * | 2/1998 | DeVilbiss | 365/145 |
| 6,191,971 B1 | * | 2/2001 | Tanaka et al. | 365/145 |
| 6,529,398 B1 | * | 3/2003 | Nair et al. | 365/145 |
| 6,788,563 B2 | * | 9/2004 | Thompson et al. | 365/145 |
| 6,873,543 B2 | * | 3/2005 | Smith et al. | 365/158 |
| 6,898,104 B2 | * | 5/2005 | Ogiwara et al. | 365/145 |
| 6,912,167 B2 | * | 6/2005 | Tam | 365/207 |
| 6,980,458 B2 | * | 12/2005 | Demange et al. | 365/145 |
| 7,046,541 B2 | * | 5/2006 | Ogiwara et al. | 365/145 |
| 7,113,437 B2 | * | 9/2006 | Schweickert et al. | 365/145 |
| 7,154,768 B2 | * | 12/2006 | Chen et al. | 365/145 |
| 7,233,536 B2 | * | 6/2007 | Ogiwara et al. | 365/205 |

FOREIGN PATENT DOCUMENTS

| | | |
|---|---|---|
| JP | 11-191295 | 7/1999 |
| JP | 2004-279880 | 10/2004 |

* cited by examiner

*Primary Examiner*—Viet Q Nguyen
(74) *Attorney, Agent, or Firm*—Harness, Dickey & Pierce, P.L.C.

(57) ABSTRACT

A ferroelectric memory device including: a plurality of bit lines; a plurality of memory cells, which are connected to the bit lines, and which store prescribed data; and a sense amplifier, which is connected to a bit line, wherein the sense amplifier includes an op amp, a MOS transistor, and a capacitor, and a first input unit of the op amp is connected to a bit line, a second input unit is connected to a first voltage, an output unit is connected to a gate electrode of the MOS transistor, the MOS transistor is connected between a first node and a second voltage that is lower than the voltage of the first node, and the capacitor is connected between the first node and the bit line.

7 Claims, 5 Drawing Sheets

FERROELECTRIC MEMORY DEVICE, ELECTRONIC APPARATUS, AND FERROELECTRIC MEMORY DEVICE DRIVING METHOD

CROSS-REFERENCES TO RELATED APPLICATIONS

The entire disclosure of Japanese Patent Application No. 2005-366999, filed on Dec. 20, 2005 is expressly incorporated herein by reference.

BACKGROUND

1. Technical Field

The present invention relates to a ferroelectric memory device, electronic apparatus, and a ferroelectric memory device driving method (read out method).

2. Related art

A traditional ferroelectric memory device is disclosed in JP-A-11-191295 (Patent Literature 1). The traditional ferroelectric memory device disclosed in the above-mentioned Patent Literature 1, subsequent to reading data from a memory cell, writes the data "0" to the same memory cell, which the ferroelectric reads out in a non-inverse state, once again carries out readout a second time from the same memory cell, and, using the data read out the second time as reference, detects the data read out the first time in accordance with a sense amplifier. [Patent Literature 1] JP-A-11-191295.

SUMMARY

With the above-mentioned traditional ferroelectric memory device, there are cases where the data read out the first time and the reference voltage read out the second time constitute the same voltage, requiring a unit that sets an offset between the data read out the first time and the reference voltage read out the second time.

When this offset setting unit sets an offset between the data read out the first time and the reference voltage read out the second time, this offset is always an approximately constant value.

However, the problem is that when this offset is set at an approximately constant value, if, for example, there are fluctuations in the characteristics between respective ferroelectric capacitors, or ferroelectric capacitor characteristics change due to aged deterioration, it is not possible to ensure an adequate read margin, making it impossible to accurately read out stored data.

Accordingly, the inventors have finished filing an invention related to a ferroelectric memory device with high readout accuracy as Patent Application 2004-279880.

As will be explained in detail below, the ferroelectric memory device disclosed in this Patent Application 2004-279880 converts the amount of electrification discharged on a bit line to voltage, while suppressing the rise of bit line voltage via an integration circuit that makes use of an operational amplifier (op amp) and a feedback capacitor. However, a circuit such as this requires that the adjustment accuracy of the op amp be improved because adjusting the op amp could result in op amp output oscillation.

Accordingly, an advantage of some aspects of the invention is the provision of a ferroelectric memory device capable of solving for the above problems. This advantage is achieved by combining the characteristics disclosed in the independent claims. Further, the dependent claims set forth specific examples that are merely advantageous to the present invention.

To achieve the above advantage, an aspect of the present invention provides a ferroelectric memory device comprising: a plurality of bit lines; a plurality of memory cells, which are connected to the bit lines, and which store prescribed data; and a sense amplifier, which is connected to a bit line, wherein the sense amplifier comprises an op amp, MOS transistor, and capacitor, a first input unit of the op amp is connected to a bit line, a second input unit is connected to a first voltage, and an output unit is connected to a gate electrode of the MOS transistor, the MOS transistor is connected between a first node and a second voltage, which is lower than the voltage of the first node, and the capacitor is connected between the first node and the bit line.

According to the above aspect, even if the voltage of a bit line rises based on the data stored in a memory cell, the rise of the bit line voltage can be held in check by the MOS transistor being turned ON by the op amp (The bit line can be maintained at approximately the first voltage). Conversely, even if the voltage on a bit line drops, turning OFF the MOS transistor can prevent oscillation resulting from phase mismatch (mismatch of the phase difference).

In the above-mentioned ferroelectric memory device, the constitution is such that a ferroelectric capacitor is provided inside a memory cell, and one end of the ferroelectric capacitor is connected to a bit line at read out, and, for example, the first voltage can be a ground voltage, and the MOS transistor can be a n-type MOS transistor.

According to the above aspect, because a bit line can maintain practically 0V, sufficient potential is continuously applied to the ferroelectric capacitor inside a memory cell at read out. Thus, it is possible to increase the amount of charge extracted from the ferroelectric capacitor.

In the above-mentioned ferroelectric memory device, a determination unit is provided at the first node of a sense amplifier, making it possible to determine the data stored in a memory cell connected to a bit line.

In the above-mentioned ferroelectric memory device, a switching unit is provided between the plurality of bit lines and a sense amplifier, making it possible for the plurality of bit lines to share a single sense amplifier in accordance with connecting one of the plurality of bit lines to the sense amplifier by switching the switching unit.

According to the above aspect, it is possible to reduce the number of sense amplifiers, and to reduce the chip area.

In the above-mentioned ferroelectric memory device, at least one reference voltage generator, which is connected to the first node of a sense amplifier that is connected to a first bit line of a plurality of bit lines, can be provided, and an output signal of the above-mentioned reference voltage generator can be inputted to the above-mentioned determination unit.

According to the above aspect, since a reference voltage can be generated using the same sense amplifier as the sense amplifier which is used at readout, design is easy, and it is possible to realize a readout operation that is stable in the face of fluctuations in transistor and ferroelectric characteristics.

An electronic apparatus of the present invention comprises the above-mentioned ferroelectric memory device. The term "electronic apparatus" as used here refers to an ordinary apparatus, which comprises a semiconductor storage device related to the present invention, and which exhibits fixed functions.

The constitution thereof is not limited in particular, but, for example, includes various apparatuses that require storage devices, such as ordinary computers, cellular telephones, PHS (Personal Handyphone System), PDA (Personal Data Assistants), electronic notebooks, and IC cards, which comprise the above-mentioned semiconductor storage device.

To achieve the above-mentioned advantage, an aspect of the present invention provides a driving method of a ferroelectric memory device, which comprises a plurality of bit lines; a plurality of memory cells, which are connected to a bit line, and which store prescribed data; and a sense amplifier, which is connected individually to a bit line, and the sense amplifier comprises a MOS transistor, which is connected between a first node and a second voltage that is lower than a voltage of the first node; an op amp, in which a first input unit is connected to the bit line, a second input unit is connected to the first voltage, and an output unit is connected to a gate electrode of the MOS transistor; and a capacitor, which is connected between the first node and the bit line, the driving method comprising, when data stored in a memory cell is read out on the bit line, lowering the voltage of the bit line by turning ON the MOS transistor in response to a rise in voltage from a prescribed voltage of the bit line; and turning OFF the MOS transistor in response to a drop in voltage from the prescribed voltage of the bit line.

According to the above aspect, even when the voltage of the bit line rises on the basis of data stored in a memory cell, it is possible to hold the rise of the bit line voltage in check by virtue of the op amp turning ON the MOS transistor (making it possible to maintain the bit line at practically the first voltage). Conversely, even when the voltage of a bit line drops, it is possible to prevent oscillation resulting from a phase mismatch by turning OFF the MOS transistor.

According to the above aspect, it is possible to improve the readout (drive) accuracy and enhance the characteristics of a ferroelectric memory device.

DESCRIPTION OF EXEMPLARY EMBODIMENTS

First Embodiment

The present invention will be explained hereinbelow with the help of the embodiments of the invention while referring to the figures, but the following embodiments do not limit the invention related to the claims, and further, all of the combinations of characteristics explained in the embodiments are not always essential to solve the problems by the invention.

Figure 1:
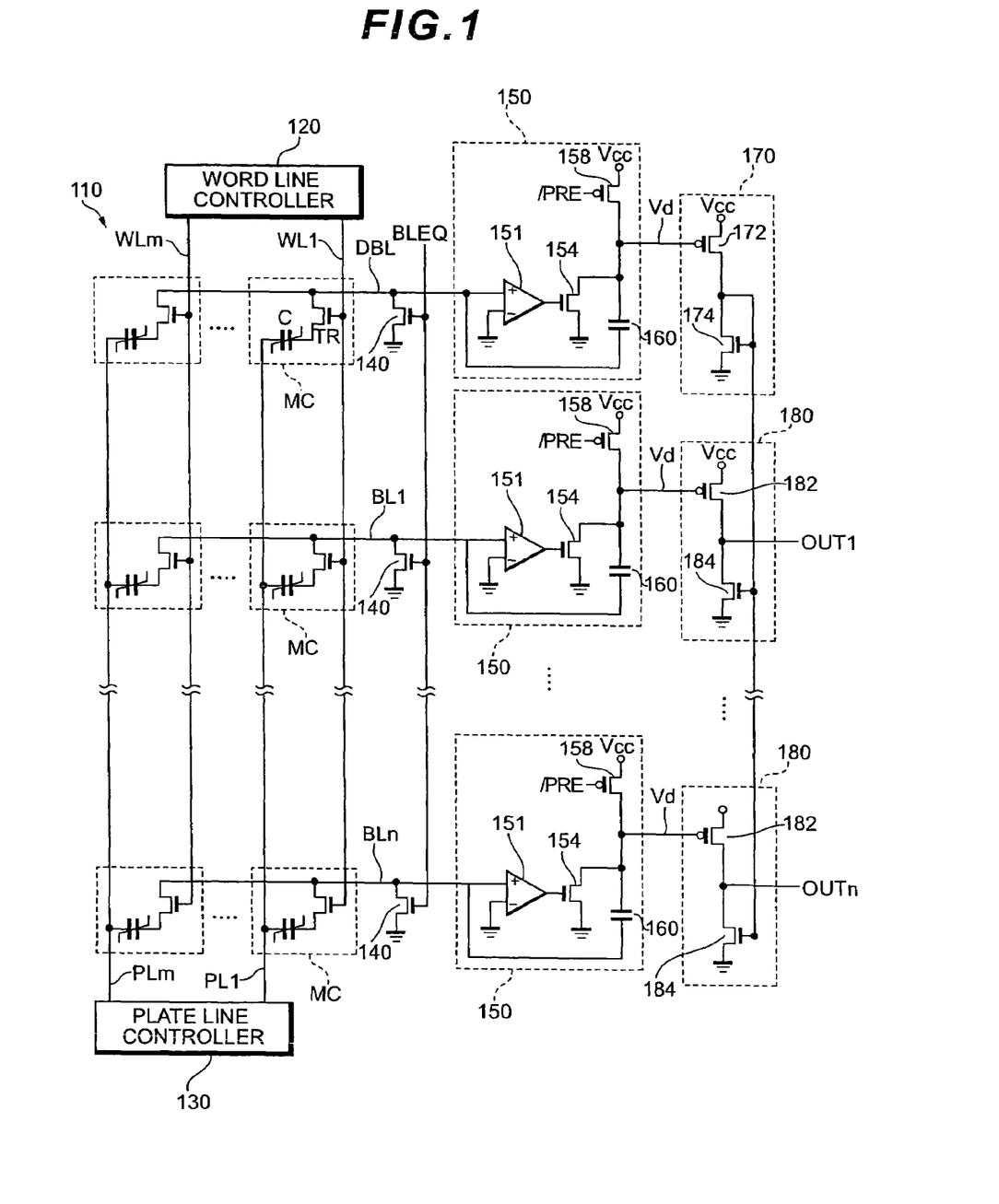
FIG. 1 is a circuit diagram showing a ferroelectric memory device of a first embodiment.

FIG. 1 is a circuit diagram showing a ferroelectric memory device of this embodiment. The ferroelectric memory device is constituted comprising a memory cell array 110, a word line controller 120, a plate line controller 130, a n-type MOS transistor 140, a sense amplifier 150, a reference voltage generator 170, and a determination unit 180.

Further, the ferroelectric memory device is constituted comprising m (m is a positive integer) word lines WL1 through m, and plate lines PL1 through m, n (n is a positive integer) bit lines BL1 through n, and a dummy bit line DBL.

The memory cell array 110 comprises m×(n+1) memory cells MC (including the memory cell MC connected to the dummy bit line DBL), which are arranged in an array. A memory cell MC is constituted comprising a n-type MOS transistor TR, and a ferroelectric capacitor C.

The gate (gate electrode) of a n-type MOS transistor (n channel-type MOS transistor, n channel-type MOSFET) TR is connected to any of the word lines WL1 through m, the source is connected to the dummy bit line (DBL) and any of the bit lines BL1 through n, and the drain is connected to one end of the ferroelectric capacitor C. That is, a n-type MOS transistor TR switches between connecting and disconnecting one end of the ferroelectric capacitor C to the dummy bit line DBL and the bit lines BL1 through n based on the voltage of the word lines WL1 through m. Furthermore, in this specification, the source and drain are referred to as the one end and the other end of the MOS transistor, and collectively are referred to as the "source-drain electrode."

The other end of the ferroelectric capacitor C is connected to any of the plate lines PL1 through m, and the ferroelectric capacitor C stores prescribed data based on the voltage differential of this one end and this other end, and discharges a charge of a prescribed amount on the dummy bit line DBL and the bit lines BL1 through n based on the data being stored. In this embodiment, the ferroelectric capacitor C stores a "0" when the potential of the other end is higher than the antivoltage of the voltage of the one end, and stores a "1" when the voltage of the one end is higher than the antivoltage of the voltage of the other end.

The word line controller 120 is connected to word lines WL1 through m, and controls the voltage of the word lines WL1 through m. More specifically, the word line controller 120 increases the voltage of a prescribed word line WL of the word lines WL1 through m higher than the voltage of another word line WL based on an address signal supplied from outside the ferroelectric memory device, selecting n memory cells MC that are connected to this prescribed word line WL.

The plate line controller 130 is connected to plate lines PL1 through m, and controls the voltage of plate lines PL1 through m. More specifically, the plate line controller 130 increases the voltage of a prescribed plate line PL of the plate lines PL1 through m higher than the voltage of another plate line PL based on an address signal, selecting this prescribed plate line PL.

The source of the n-type MOS transistor 140 is grounded (it is connected to the ground voltage), and the drain is connected to the dummy bit line DBL and the bit lines BL1 through n. Further, a BLEQ signal is supplied to the gate, and the n-type MOS transistor 140 switches between grounding and ungrounding the dummy bit line DBL and the bit lines BL1 through n based on the voltage of the BLEQ signal.

The sense amplifier 150 is constituted comprising an op amp (operational amplifier) 151, a n-type MOS transistor 154, a p-type MOS transistor (pre-charge unit) 158, and a capacitor 160. A sense amplifier 150 is provided corresponding respectively to the dummy bit line DBL and the bit lines BL1 through n, and amplifies and outputs the voltage of the dummy bit line DBL and the bit lines BL1 through n when data is read out from a memory cell MC.

A positive input (in-phase input terminal, first input unit) of the op amp 151 is connected to the dummy bit line DBL and the bit lines BL1 through n, and a negative input (negative-phase input terminal, reverse input terminal, second input terminal) is grounded. Further, an output is connected to the gate of the n-type MOS transistor 154. Then, the op amp 151 changes the gate voltage of the n-type MOS transistor 154 based on a change in the voltage of the dummy bit line DBL and the bit lines BL1 through n.

A source of the n-type MOS transistor 154 is grounded, and a drain is connected to an output (node Vd) of a sense amplifier 150. Then, the n-type MOS transistor 154 turns ON and OFF based on the gate voltage thereof, and furthermore, when ON, controls the resistance between the source and drain based on the gate voltage.

A source of the p-type MOS transistor 158 is supplied with the operating voltage of the ferroelectric memory device (power supply potential, drive potential) VCC, and a drain is connected to the drain of the n-type MOS transistor 154. That is, the drain is connected to the output (node Vd) of the sense amplifier 150. Then, the p-type MOS transistor 158 charges the drain (node Vd) of the n-type MOS transistor 154 with VCC voltage based on a /PRE signal (inverse signal of PRE signal), which is supplied to the gate.

One end of the capacitor 160 is connected to the drain of the n-type MOS transistor 154, and the other end is connected to the dummy bit line DBL and the bit lines BL1 through n. Then, the capacitor 160 changes the voltage of the dummy bit line DBL and the bit lines BL1 through n based on a change in the drain voltage of the n-type MOS transistor 154.

The reference voltage generator 170 and determination unit 180 are respectively constituted comprising p-type MOS transistors 172 and 182, and n-type MOS transistors 174 and 184. Then, the determination unit 180 compares the output (node Vd) of the sense amplifier 150 connected to the bit lines BL1 through n against an output of the reference voltage generator 170, and determines the data stored in a memory cell MC.

More specifically, the output (node Vd) of the sense amplifier 150, that is, the drain voltage of the n-type MOS transistor 154 is supplied to the gates of the p-type MOS transistors 172 and 182, and the drains are respectively connected to the drains of the n-type MOS transistors 174 and 184. Further, the gate of n-type MOS transistor 174 is connected to the drain thereof, and furthermore, the gate of n-type MOS transistor 184 is connected to the gate and drain of n-type MOS transistor 174, the source is grounded, and the drain constitutes outputs OUT 1 through n. That is, the p-type MOS transistor 172 and the n-type MOS transistor 174 constitute a current mirror with p-type MOS transistor 182 and n-type MOS transistor 184.

Figure 2:
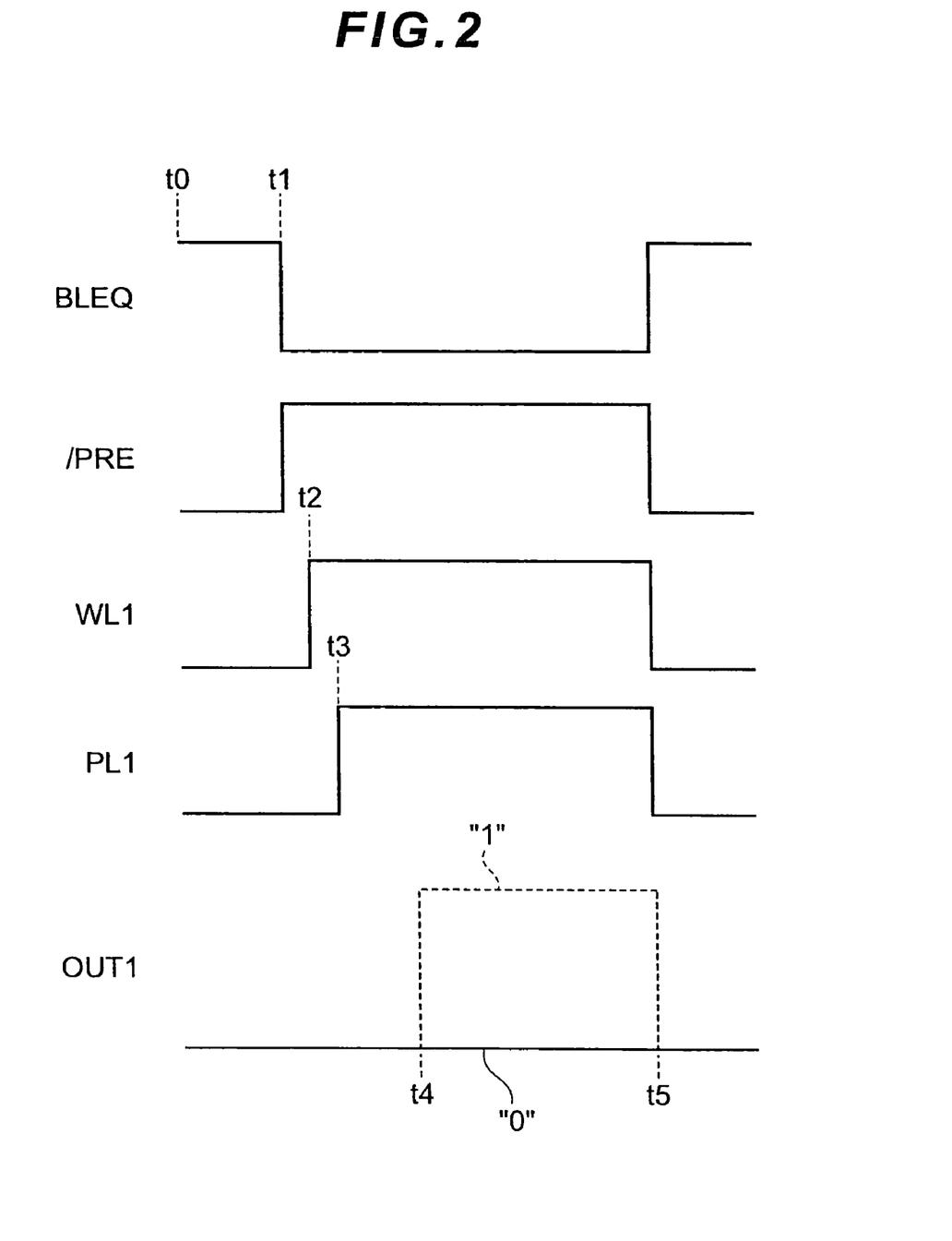
FIG. 2 is a timing chart showing the operation of a ferroelectric memory device of the first embodiment.

FIG. 2 is a timing chart showing the operation of a ferroelectric memory device of this embodiment. The operation of a ferroelectric memory device of this embodiment will be explained by referring to FIGS. 1 and 2, and using an example in which data stored in the memory cells MC connected to the bit lines BL1 through n are read by selecting a word line WL1 and a plate line PL1.

In the following example, when the respective signals indicate L logic, the voltage of this signal is ground voltage (GND, reference voltage, 0V), and when the respective signals indicate H logic, the signal voltage is VCC, VDD or VPP, which are the operating voltages of the ferroelectric memory device. Furthermore, the voltages of the respective signals are not limited thereto, and can differ as long as the voltage (potential) of a signal when H logic is indicated is higher than the voltage of a signal when L logic is indicated.

First, in the initial state (timing t0), the BLEQ signal indicates H logic, the respective n-type MOS transistors 140 are ON, and the voltage of the dummy bit line DBL and the bit lines BL1 through n are ground voltage. Then, at timing t1, the BLEQ signal becomes L logic, the respective n-type MOS transistors 140 are OFF, and the dummy bit line DBL and the bit lines BL1 through n are switched from ground voltage.

Further, in the initial state (timing t0), the /PRE signal indicates L logic, the p-type MOS transistor 158 is ON, and the drain voltage (node Vd) of the n-type MOS transistor 154 is VCC. Then, at timing t1, the /PRE signal becomes H logic, the p-type MOS transistor 158 is OFF, and the n-type MOS transistor 154 drain switches from VCC.

Next, the word line controller 120 raises the voltage of the word line WL1 at timing t2, and turns ON the n-type MOS transistor TR that constitutes the memory cell MC connected to the word line WL1. The ferroelectric capacitor C constituting the memory cell MC connected to the word line WL1 is thereby connected to the dummy bit line DBL and the bit lines BL1 through n.

Next, at timing t3, the plate line controller 130 raises the voltage of the plate line PL1 to VCC. This makes the voltage of the dummy bit line DBL and the bit lines BL1 through n the reference, applying a high potential to the ferroelectric capacitor C, which constitutes the memory cell MC connected to the word line WL1.

Accordingly, since a charge extracted from the ferroelectric capacitor C in accordance with the data stored in this ferroelectric capacitor C is discharged on the dummy bit line DBL and the bit lines BL1 through n, the voltage of the dummy bit line DBL and the bit lines BL1 through n rises based on the data stored in the respective memory cells MC.

Figure 3:
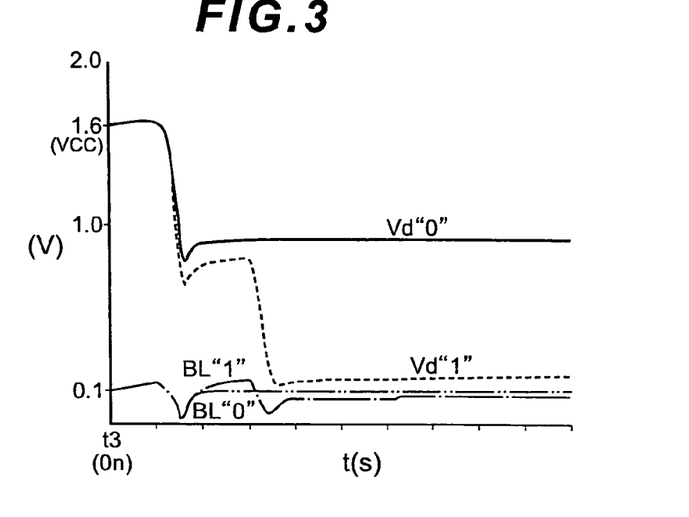
FIG. 3 is a graph showing changes in node Vd voltages and changes in bit line voltages.

FIG. 3 is a graph showing changes in node Vd voltages and changes in bit line voltages at timing t3 and beyond. The horizontal axis shows times t(s) at timing t3 and beyond, and the vertical axis shows voltages (V). BL "1" and Vd "1" indicate changes in the voltages of a bit line and node Vd when the data "1" is stored in a memory cell, and BL "0" and Vd "0" indicate changes in the voltages of a bit line and node Vd when the data "0" is stored in a memory cell.

As shown in the figure, the node Vd voltage (Vd "1") when the data stored in a memory cell MC is "1" drops more rapidly than the node Vd voltage (Vd "0") when the pertinent data is "0".

In other words, when the voltage of the plate line PL1 is raised to VCC, a high voltage, which is less than VCC, is applied to the memory cell MC by the operation of a not-shown resistance component that exists on the bit line BL, and a charge corresponding to the applied high voltage is discharged on the bit line BL. Thus, the voltage of the bit line BL rises, curbing the rise of the high potential in the memory cell MC.

The sense amplifier 150 rapidly transfers the discharged cumulative charge to the node Vd at this time. More specifically, when the voltage of the bit line BL connected to the positive input rises, and the voltage difference with the ground voltage exceeds a prescribed voltage, the op amp 151 quickly sets the output thereof to H level. As a result of this, the n-type MOS transistor 154 turns ON. When the n-type MOS transistor 154 turns ON, the drain thereof is connected to the grounded source via the channel resistance (ON resistance) of the n-type MOS transistor 154. As a result of this, the drain voltage Vd, that is, the voltage of the one end of the capacitor 160 quickly drops. At this time, the capacitor 160 curbs the rising voltage (lowers the voltage) of the other end thereof, that is, of the bit lines BL1 through n, based on this drop (in accordance with coupling).

Next, when the voltage of the bit line BL connected to the positive input drops, and the voltage difference with the ground voltage becomes less than a prescribed voltage, the output of the op amp 151 quickly becomes L level. As a result, the n-type MOS transistor 154 turns OFF, and the drop of bit line BL voltage is stopped.

As described above, the fact that the bit line BL voltage drops, causes the high potential being applied to the memory cell MC via the not-shown resistance component that exists on the bit line BL to rise further, a charge is once again discharged on the bit line BL, and the bit line BL potential rises. Thus, the output of the op amp 151 once again becomes H level (the n-type MOS transistor 154 turns ON). Thus, the switching of the output of the op amp 151 (the ON, OFF of the n-type MOS transistor 154) causes an approximate VCC voltage to be applied to the memory cell MC, and this is repeated until the discharging of the charge from the memory cell stops. The above-described operation makes it possible to rapidly lower the voltage of the node Vd.

A difference in the number of times the op amp 151 output is switched occurs in accordance with the amount of the charge discharged from the memory cell MC at this time. That is, because a large amount of charge is discharged from the memory cell MC when the data stored in the memory cell MC is "1", the op amp 151 output is switched many times, and the potential of the bit line BL also increases many times, causing the voltage of the node Vd to drop significantly.

Conversely, since a small amount of charge is discharged from a memory cell MC when the data stored in the memory cell MC is "0", the number of times the output of the op amp 151 switches is few, and the potential of the bit line BL is not raised very often, causing the voltage of the node Vd to drop slightly.

Further, according to this embodiment, since the output of the op amp 151 is connected to the gate of the n-type MOS transistor 154, op amp oscillation resulting from phase mismatch can be prevented.

Figure 4:
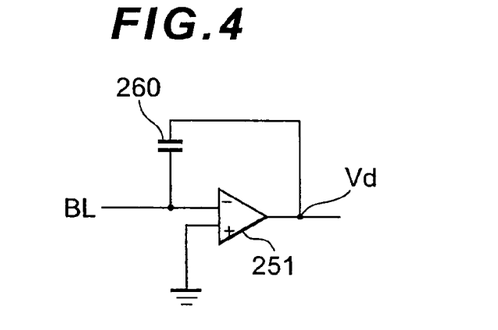
FIG. 4 is a circuit diagram for explaining the effect of the first embodiment.

FIG. 4 is a circuit diagram for explaining the effect of this embodiment. If the output of an op amp 251 is fed back via an integration capacitor 260 as shown in FIG. 4, when the bit line BL voltage (negative input) rises, the output becomes L level, and the voltage of the other end of the integration capacitor 260, which is connected to the output, also drops. As a result, the voltage of the other end of the integration capacitor 260, that is, the voltage of the bit line BL, drops as a result of coupling. By contrast, when the voltage of the bit line BL drops, the output of the op amp becomes H level, and the voltage of the bit line BL rises.

In a case such as this, a phase mismatch is likely to occur between the voltage change of the bit line BL and the operation of the op amp (between the input and output of the op amp), and when a phase mismatch occurs, the output of the op amp oscillates. As a result, readout accuracy declines. Further, in order to prevent oscillation resulting from this kind of phase mismatch, op amp adjustment must be accurate.

By contrast, according to this embodiment, when the voltage of the bit lines BL1 through n drops, the bit line voltage is prevented from rising by simply turning OFF the n-type MOS transistor 154, thus making it possible to prevent op amp 151 oscillation, and to enhance readout accuracy. The op amp design margin is also broadened. Further, as will be explained hereinbelow, the op amp can also be made faster.

Figure 7:
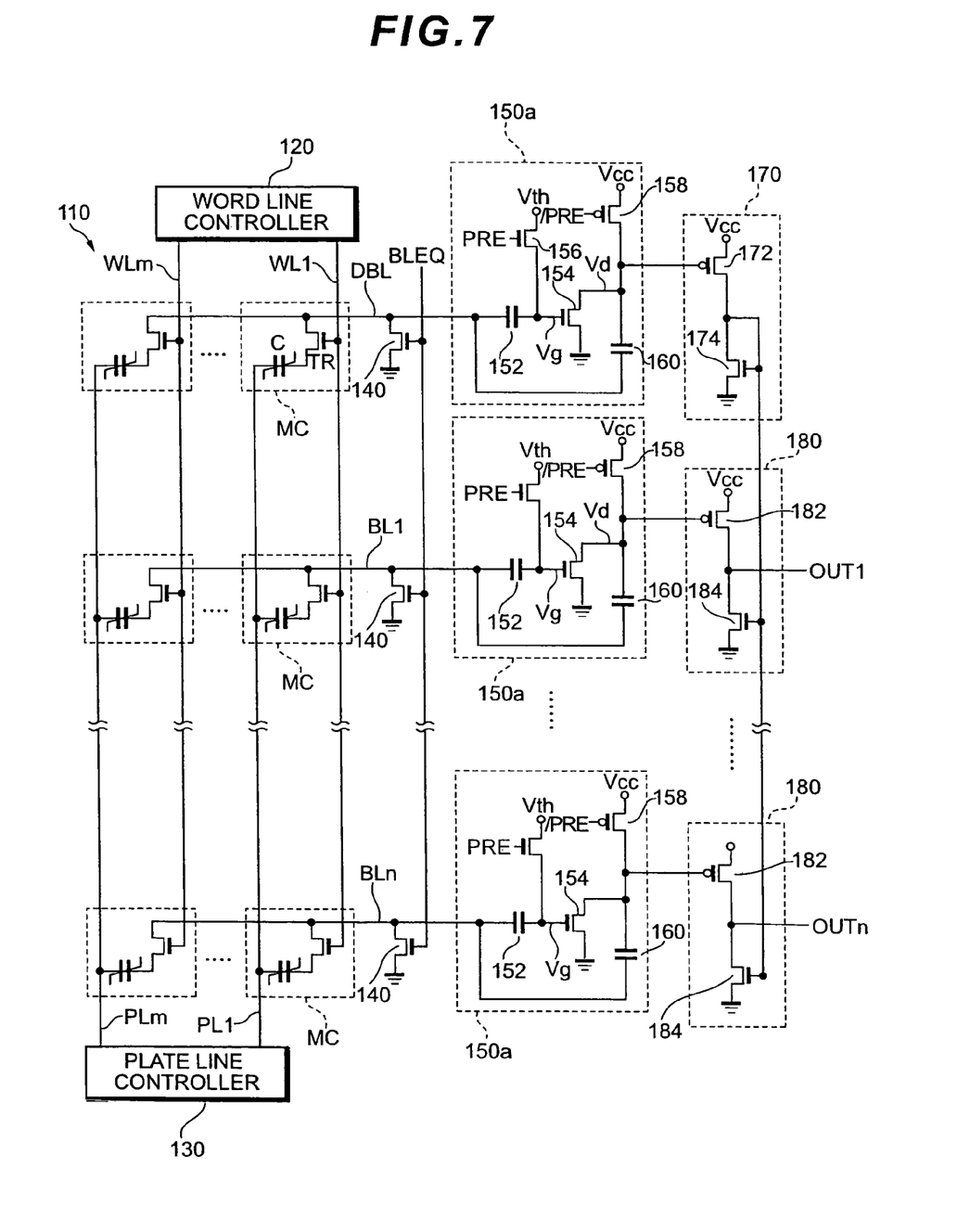
FIG. 7 is another circuit diagram for explaining the effect of the first embodiment.

FIG. 7 is another circuit diagram for explaining the effect of this embodiment. In the circuit shown in FIG. 7, a sense amplifier 150a is constituted comprising a capacitor 152, n-type MOS transistors 154 and 156, a p-type MOS transistor 168, and a capacitor 160. Furthermore, since the other components are the same as in FIG. 1, explanations thereof will be omitted.

One end of the capacitor 152 is connected to the dummy bit line DBL and the bit lines BL1 through n, and the other end is connected to the gate of the n-type MOS transistor 154. Then, the capacitor 152 changes the gate voltage of the n-type MOS transistor 154 based on the voltage of the dummy bit line DBL and the bit lines BL1 through n.

The source of the n-type MOS transistor 154 is grounded, and the drain is connected to the output of the sense amplifier 150a (node Vd). Then, the n-type MOS transistor 154 turns ON or OFF based on the gate voltage thereof, and when ON, also controls the resistance between the source and drain based on the gate voltage.

The source of the n-type MOS transistor 156 is connected to the gate of the n-type MOS transistor 154, and the drain is supplied with voltage Vth in the vicinity of the threshold voltage of the n-type MOS transistor 154. Then, the n-type MOS transistor 156 charges the gate of the n-type MOS transistor 154 to the vicinity of that threshold voltage based on the voltage of a PRE signal supplied to the gate.

The source of the p-type MOS transistor 158 is supplied with the operating voltage VCC of the ferroelectric memory device, which is an example of a second voltage, and the drain is connected to the n-type MOS transistor 154. Then, the p-type MOS transistor 158 charges the drain of the n-type MOS transistor 154 with VCC voltage based on a /PRE signal (inversion signal of a PRE signal), which is supplied to the gate.

The one end of the capacitor 160 is connected to the drain of the n-type MOS transistor 154, and the other end is connected to the dummy bit line DBL and the bit lines BL1 through n. Then, the capacitor 160 changes the voltage of the dummy bit line DBL and the bit lines BL1 through n based on a change in the drain voltage of the n-type MOS transistor 154.

In a circuit of such a constitution, the problem is that since the gate potential of the n-type MOS transistor 154 does not rise much, the node Vd rapidly discharges even at a data "1" readout, when this potential rises more than at a data "0" readout.

Accordingly, increasing the size of the n-type MOS transistor 154, and gaining discharge capabilities for rapidly discharging a node Vd without raising the gate potential of this transistor much can also be considered.

However, since the load increases when the gate capacity increases, it becomes difficult for the gate potential to rise further. To solve for this problem, the amount of gate capacity augmentation must be offset by increasing the size of the capacitor 152 to match the size of the n-type MOS transistor 154.

Further, in this case, the node Vd is rapidly discharged even at "0" data readout, when bit line potential does not rise much, and the potential difference of the data "0"/"1" becomes small. In addition, a drop in node Vd potential is transmitted via gate capacity, causing gate potential to decrease. A method of dealing with this by making the capacitor 152 even larger can be considered, but with this method, it is impossible to completely offset the drop in this gate potential.

Then, when the capacitor 152 is enlarged, a phenomenon occurs in which the patterning area increases, and bit line load becomes greater, the rise of bit line potential becomes smaller, and the rise of gate potential weakens. As a result, the situation once again becomes such that it is not possible to discharge the node Vd rapidly.

Thus, in the circuit of FIG. 7, increasing speed is problematic, and, in fact, forcibly increasing speed also causes the readout margin to decline, restricting the scope thereof such that the circuit is used in devices with low speed requirements.

By contrast, in this embodiment, since the gate potential of the n-type MOS transistor 154 is controlled by the output of the op amp 151, it is possible to achieve faster speeds while maintaining the readout margin.

In this embodiment, at this point a "0" is stored in the ferroelectric capacitor C, which is connected to the dummy bit line DBL. Further, the surface area of this ferroelectric capacitor C is made larger than that of the other ferroelectric capacitor C. For this reason, the amount of charge discharged on the dummy bit line DBL from this ferroelectric capacitor C is greater than the amount of charge discharged on the bit lines BL1 through n from the ferroelectric capacitor C in which a "0" is stored. Therefore, a voltage, which falls between the drain voltage Vd when the data stored in a memory cell MC connected to the bit lines BL1 through n is "0" and the drain voltage when this data is "1", is applied to the gate of the p-type MOS transistor 172 of the reference voltage generator 170. At this time, the reference voltage generator 170 converts the current flowing to the p-type MOS transistor 172 to a reference voltage, and supplies same to the determination unit 180.

Then, the determination unit 180 determines the data stored in a memory cell MC by comparing the current flowing to the p-type MOS transistor 172 against the current flowing to the p-type MOS transistor 182. More specifically, when the gate voltage of the p-type MOS transistor 182 is higher than the gate voltage of the p-type MOS transistor 172, that is, when the data stored in a memory cell MC connected to the bit lines BL1 through n is "0", since the current flowing to the p-type MOS transistor 182 is less than the current flowing to the p-type MOS transistor 172, the drain voltage of the p-type MOS transistor 182, which is the output of the determination unit 180, drops to the vicinity of the ground voltage, and when this data is "1", since the current flowing to the p-type MOS transistor 182 is greater than the current flowing to the p-type MOS transistor 172, this drain voltage rises to the vicinity of VCC (Refer to OUT1, timing t4 and t5 of FIG. 2). In a ferroelectric memory cell of this embodiment, data stored in a ferroelectric capacitor C is read out in accordance with the above operation.

Figure 5:
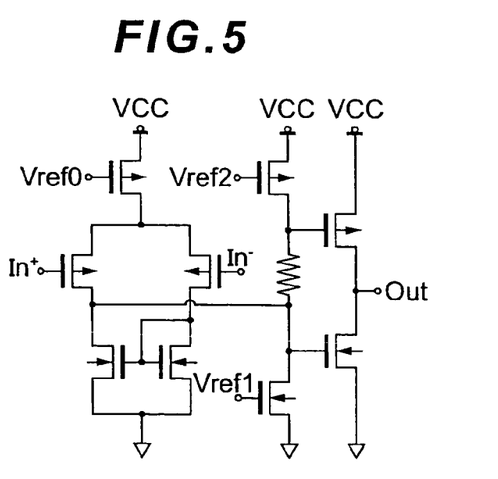
FIG. 5 is a diagram showing an example of the constitution of an op amp.

FIG. 5 shows an example of the constitution of an op amp. As shown in the figure, an op amp can be constituted from a plurality of MOS transistors and a resistor. In+ is positive input, In− is negative input, and OUT is output. Further, Vref0, Vref1 and Vref2 are reference voltages. Furthermore, this circuit is merely one example of an op amp, and an op amp is not limited to such a constitution.

Further, in this embodiment, the area of the ferroelectric capacitor C connected to the dummy bit line DBL has been enlarged, and is storing a "0", but the area of the ferroelectric capacitor C connected to the dummy bit line DBL can also be made smaller, and can store a "1". Further, the area of the ferroelectric capacitor C connected to the dummy bit line DBL can also be made equivalent to the area of the other ferroelectric capacitor C, the driving capability of the p-type MOS transistor 172 can be made greater than the driving capability of the p-type MOS transistor 182, and the driving capability of the n-type MOS transistor 174 can be made greater than the driving capability of the n-type MOS transistor 184.

Further, the source of the n-type MOS transistor 154 is set to ground, and the source of the p-type MOS transistor 158 is set to VCC, but the former is low potential and the latter is high potential, making it possible for a potential difference to exist between the former and the latter. Further, since the p-type MOS transistor 158 can comprise a function for precharging the node Vd, it can be a n-type MOS transistor.

Further, in this embodiment, a so-called 1T1C-type memory cell was explained in the example, but a 2T2C-type memory cell can also be used.

Second Embodiment

In the first embodiment, as shown in FIG. 3, a case in which the voltage of a bit line (BL "1") is pulled down by the op amp 151 two times was explained, but the number of times is not limited, and can be either one time, or three or more times.

When the number of times that the bit line voltage is pulled down by the op amp 151 increases, since the voltage fluctuation of the bit line BL is lessened, the potential difference of BL "1" and BL "0" is reduced. As a result, since the charge transfer from the bit line BL to the node Vd is carried out the same way as "1" and "0", the effect is that malfunctions are reduced by accurately expressing the difference of charges discharged from a memory cell MC as potential differences of the node Vd.

By contrast, when the number of times that the bit line voltage is pulled down by the op amp decreases, since the voltage fluctuation of the bit line BL increases, the effect is that the potential difference of Vd "1" and Vd "0" becomes large (the readout margin increases), and the readout speed becomes faster. That is, as shown in FIG. 3, the voltage of the bit line BL goes beyond 0V and drops to a negative potential in accordance with the time lag of the op amp input and output. Therefore, since the voltage difference between a bit line BL and a plate line PL, that is, the voltage applied to the ferroelectric capacitor C can be maintained for the most part, it is possible to increase the amount of charge discharged on the bit line BL, and it is also possible to enhance the discharge speed of the charge. As a result, the difference of the charges discharged on the "1" and "0" bit lines BL expands, the readout margin increases, and the readout speed becomes faster.

Possible methods for reducing the number of times bit line voltage is pulled down by the op amp include decreasing op amp sensitivity, or reducing the op amp operating speed, and lowering nMOS capabilities or lessening the capacity of the capacitor. In other words, the readout margin can still be increased, and readout speed can still be improved even if op amp sensitivity is decreased, the op amp operating speed reduced, the nMOS capabilities lowered, or capacitor capacity lessened.

Of course, it is also alright to increase op amp sensitivity, to enhance the operating speed of the op amp, to improve nMOS capabilities, and to increase the capacity of the capacitor. In this case, as explained above, the likelihood of a malfunction occurring will become less than when bit line voltage is pulled down by the op amp fewer times. However, even when bit line voltage is pulled down fewer times by the op amp, the likelihood of a malfunction will be extremely small, and will not impede normal use.

Third Embodiment

In the first embodiment, a sense amplifier 150 was provided on all the bit lines BL1 through n, and on the dummy bit line DBL, but a sense amplifier 150 can also be shared by using a switching circuit.

Figure 6:
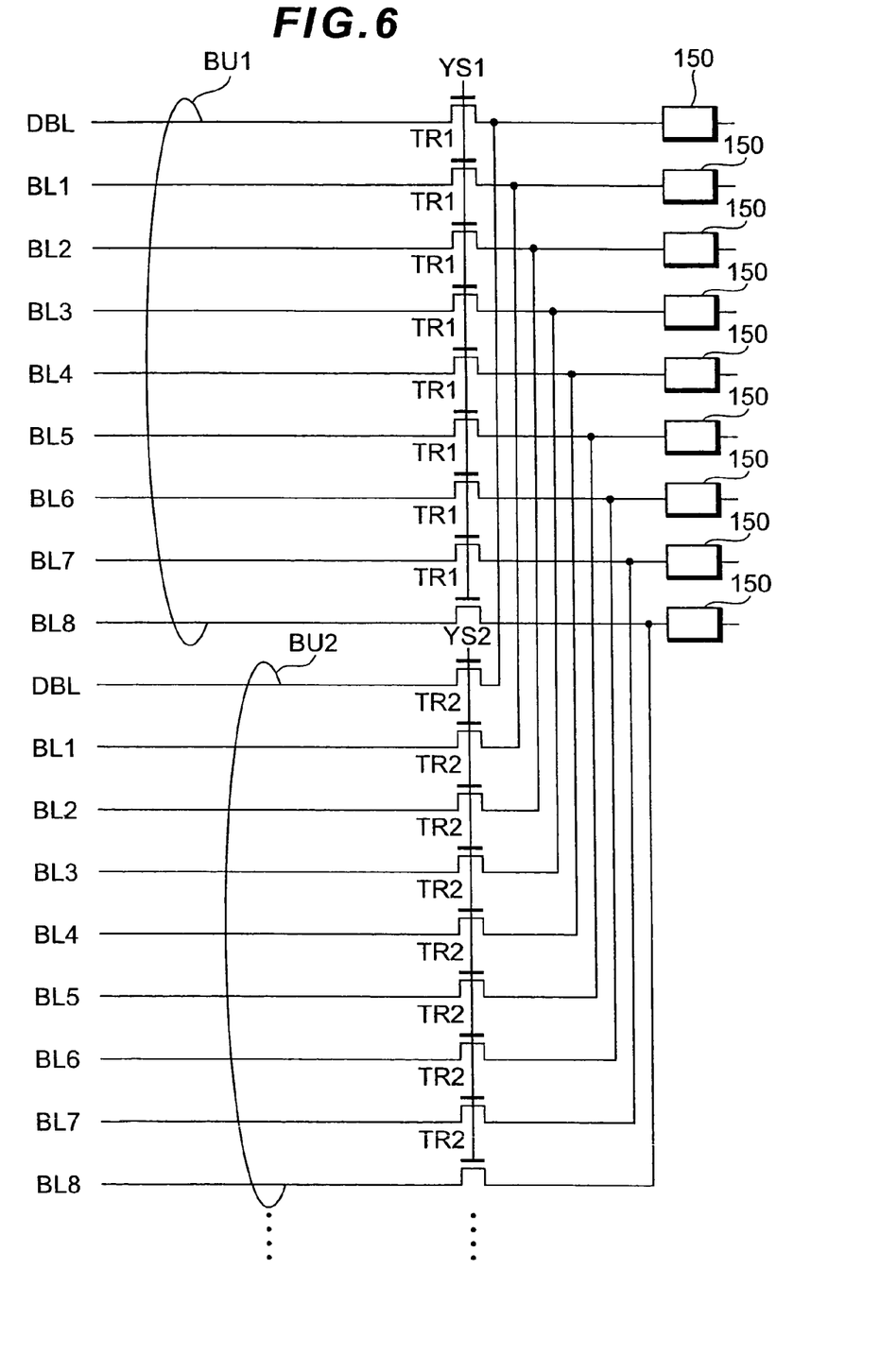
FIG. 6 is a circuit diagram showing a ferroelectric memory device of a third embodiment.

FIG. 6 is a circuit diagram showing a ferroelectric memory device of this embodiment. Furthermore, to make the explanation easier to understand, the relationship between a bit line BL and a sense amplifier 150 is made clear in FIG. 6, but the memory cell array, word line (controller), plate line (controller), n-type MOS transistor, reference voltage generator, and determination unit, which were explained in the first embodiment while referring to FIG. 1 and so forth, have been omitted.

As shown in FIG. 6, the dummy bit lines DBL and bit lines BL 1 through 8 are treated as bundles (BU1, BU2, . . . ), and the connections between the bit lines and the nine sense amplifiers 150 are switched by n-type MOS transistors TR1, TR2, which are connected to the respective bit lines. The n-type MOS transistors TR1, TR2 are respectively driven by signals YS1, YS2. The n-type MOS transistors TR1, TR2 are examples of switching circuits, and the connection between a bit line BL and a sense amplifier 150 can be controlled by other units. Further, the number of bit lines in a single bundle, that is, the number of sense amplifiers being shared can be changed as needed.

Thus, in this embodiment, since a sense amplifier 150 is used in common, it is possible to reduce the area occupied by sense amplifiers 150, making it possible to either increase the integration level or reduce the size of the ferroelectric memory device. Further, without the need to arrange a sense amplifier 150 between bit lines BL, the spacing between bit lines BL can be narrowed. As a result, it is possible to either increase the integration level or reduce the size of the ferroelectric memory device.

The present invention is not limited to the descriptions of the above-mentioned embodiments, and the examples and applications explained hereinabove through the embodiments of the present invention can be utilized by combining them as needed, or adding changes or improvements in accordance with the usage. It is clear from the disclosures of the claims that even an aspect that adds such a combination, change or improvement can be included in the technological scope of the present invention.

What is claimed is:

1. A ferroelectric memory device, comprising:
   a plurality of bit lines;
   a plurality of memory cells, which are connected respectively to the plurality of bit lines, and which store prescribed data; and
   a sense amplifier, which is connected to one bit line of the plurality of bit lines, the sense amplifier including an op amp, a MOS transistor, and a capacitor,
   a first input node of the op amp being connected to the one bit line, a second input node being connected to a first terminal having a first voltage, and an output node being connected to a gate electrode of the MOS transistor,
   the MOS transistor being connected between a first node of the sense amplifier and a second terminal having a second voltage, the second voltage being lower than a voltage of the first node, and
   the capacitor being connected between the first node and the one bit line.

2. The ferroelectric memory device according to claim 1, a ferroelectric capacitor being provided inside one memory cell of the plurality of memory cells, and one end of the ferroelectric capacitor being connected to the one bit line at readout, the first voltage being ground voltage, and the MOS transistor being an n-type MOS transistor.

3. The ferroelectric memory device according to claim 1, further comprising:
   a determination unit which is connected to the first node of the sense amplifier, the determination unit determining data stored in one memory cell of the plurality of memory cells, the one memory cell being connected to the one bit line.

4. The ferroelectric memory device according to claim 1, further comprising:
   a switching unit between the one bit line and the sense amplifier, the one bit line being connected to the sense amplifier by switching the switching unit.

5. The ferroelectric memory device according to claim 3, further comprising:
   at least one reference voltage generator which is connected to the first node of the sense amplifier that is connected to a first bit line of the plurality of bit lines, an output signal of the reference voltage generator being inputted to the determination unit.

6. An electronic apparatus, comprising:
   the ferroelectric memory device according to claim 1.

7. A driving method of a ferroelectric memory device, which includes:
   a plurality of bit lines;
   a plurality of memory cells, which are connected respectively to the plurality of bit lines, and which store prescribed data; and
   a sense amplifier, which is connected to one bit line of the plurality of bit lines, the sense amplifier including an op amp, a MOS transistor, and a capacitor, a first input node of the op amp being connected to the one bit line, a second input node being connected to a first terminal having a first voltage, and an output node being connected to a gate electrode of the MOS transistor, the MOS transistor being connected between a first node of the sense amplifier and a second terminal having a second voltage, the second voltage being lower than a voltage of the first node, and the capacitor being connected between the first node and the one bit line,
   the driving method comprising:
   when data stored in one memory cell of the plurality of memory cells is read out on the one bit line,
   lowering the voltage of the one bit line by turning ON the MOS transistor in response to a rise of voltage from a prescribed voltage of the one bit line; and
   turning OFF the MOS transistor in response to a drop of voltage from the prescribed voltage of the one bit line.

\* \* \* \* \*